(12) United States Patent
Farahani et al.

(10) Patent No.: US 10,770,870 B2
(45) Date of Patent: Sep. 8, 2020

(54) CONTAINERIZED POWER FLOW CONTROL SYSTEMS

(71) Applicant: Smart Wires Inc., Union City, CA (US)

(72) Inventors: Ali Farahani, Yorba Linda, CA (US); Ted Bloch-Rubin, Ann Arbor, MI (US); Casey Heier, Oakland, CA (US); Tarek Khoury, Albany, CA (US); Mark Sanders, Kalispell, MT (US); Will Schmautz, Kalispell, MT (US)

(73) Assignee: Smart Wires Inc., Union City, CA (US)

( * ) Notice: Subject to any disclaimer, the term of this patent is extended or adjusted under 35 U.S.C. 154(b) by 0 days.

(21) Appl. No.: 16/522,286

(22) Filed: Jul. 25, 2019

(65) Prior Publication Data

US 2019/0348822 A1   Nov. 14, 2019

Related U.S. Application Data

(63) Continuation of application No. 16/035,976, filed on Jul. 16, 2018, now Pat. No. 10,396,533.

(60) Provisional application No. 62/634,057, filed on Feb. 22, 2018.

(51) Int. Cl.

| | | |
|---|---|---|
| *H02B 1/52* | (2006.01) |
| *B65D 88/12* | (2006.01) |
| *E04H 5/04* | (2006.01) |
| *H02B 1/32* | (2006.01) |
| *H05K 5/02* | (2006.01) |
| *H02J 3/18* | (2006.01) |
| *H02B 1/01* | (2006.01) |
| *G06Q 50/06* | (2012.01) |

(52) U.S. Cl.
CPC ............. *H02B 1/32* (2013.01); *B65D 88/121* (2013.01); *E04H 5/04* (2013.01); *H02B 1/01* (2013.01); *H02B 1/52* (2013.01); *H02J 3/18* (2013.01); *H05K 5/0247* (2013.01); *G06Q 50/06* (2013.01)

(58) Field of Classification Search
CPC ............ H02B 1/52; E04H 5/04; B65D 88/121
See application file for complete search history.

(56) References Cited

U.S. PATENT DOCUMENTS

| | | |
|---|---|---|
| 3,955,657 A | 5/1976 | Bossi |
| 3,959,985 A | 6/1976 | Schulze, Sr. |
| RE29,994 E | 5/1979 | Bossi |

(Continued)

FOREIGN PATENT DOCUMENTS

| | | | |
|---|---|---|---|
| FR | 2698737 A1 * | 6/1994 | ............... H02B 1/52 |
| WO | 2005/067117 | 7/2005 | |

OTHER PUBLICATIONS

"Extended European Search Report dated Sep. 9, 2019; European Patent Application No. 19153095.5", dated Sep. 9, 2019.

*Primary Examiner* — Robert J Hoffberg
(74) *Attorney, Agent, or Firm* — Womble Bond & Dickinson (US) LLP (57) ABSTRACT

A containerized power flow control system is described, for attachment to a power transmission line or substation. The system includes at least one container that is transportable by road, rail, sea or air. A plurality of identical impedance injection modules is operable while mounted in the container, wherein each of the modules is configurable to inject a pre-determined power control waveform into the power line.

18 Claims, 11 Drawing Sheets

(56) References Cited

U.S. PATENT DOCUMENTS

| | | | |
|---|---|---|---|
| 4,167,670 A | 9/1979 | Ingold | |
| 4,188,536 A | 2/1980 | DallaPiazza | |
| 4,293,902 A | 10/1981 | White | |
| 4,322,817 A | 3/1982 | Kuster | |
| 4,355,351 A | 10/1982 | Schwarz | |
| 4,683,461 A | 7/1987 | Torre | |
| 4,823,250 A | 4/1989 | Kolecki et al. | |
| 4,908,569 A | 3/1990 | Fest | |
| 5,149,277 A | 9/1992 | LeMaster | |
| 5,216,285 A | 6/1993 | Hilsenteger et al. | |
| 5,231,929 A | 8/1993 | Theurer et al. | |
| 5,270,913 A | 12/1993 | Limpaecher | |
| 5,340,326 A | 8/1994 | LeMaster | |
| 5,741,605 A | 4/1998 | Gillett et al. | |
| 5,875,235 A | 2/1999 | Mohajeri | |
| 5,892,351 A | 4/1999 | Faulk | |
| 5,917,779 A | 6/1999 | Ralson et al. | |
| 5,949,148 A | 9/1999 | Wagner | |
| 6,057,673 A * | 5/2000 | Okayama | H02J 3/1814 323/207 |
| 6,061,259 A | 5/2000 | DeMichele | |
| 6,075,349 A * | 6/2000 | Okayama | H02J 3/1814 323/207 |
| 6,198,257 B1 | 3/2001 | Belehradek et al. | |
| 6,225,791 B1 * | 5/2001 | Fujii | H02J 3/1814 323/207 |
| 6,242,895 B1 * | 6/2001 | Fujii | G05F 1/70 323/207 |
| 6,296,065 B1 | 10/2001 | Carrier | |
| 6,340,851 B1 | 1/2002 | Rinaldi et al. | |
| 6,356,467 B1 | 3/2002 | Belehradek, Jr. | |
| 6,460,626 B2 | 10/2002 | Carrier | |
| 6,477,154 B1 | 11/2002 | Cheong et al. | |
| 6,489,694 B1 | 12/2002 | Chass | |
| 6,643,566 B1 | 11/2003 | Lehr et al. | |
| 6,675,912 B2 | 1/2004 | Carrier | |
| 6,696,925 B1 * | 2/2004 | Aiello, Jr. | H01F 27/002 340/12.38 |
| 6,909,943 B2 | 6/2005 | Lehr et al. | |
| 7,141,894 B2 | 11/2006 | Kraus | |
| 7,325,150 B2 | 1/2008 | Lehr et al. | |
| 7,440,300 B2 | 10/2008 | Konishi et al. | |
| 7,453,710 B2 | 11/2008 | Baurle et al. | |
| 7,466,819 B2 | 12/2008 | Lehr et al. | |
| 7,469,759 B2 | 12/2008 | Botzelmann | |
| 7,729,147 B1 | 6/2010 | Wong et al. | |
| 8,189,351 B2 | 5/2012 | Chung et al. | |
| 8,210,418 B1 | 7/2012 | Landoll et al. | |
| 8,395,916 B2 | 3/2013 | Harrison | |
| 8,415,829 B2 * | 4/2013 | Di Cristofaro | H02B 1/52 307/39 |
| 8,434,657 B2 | 5/2013 | Landoll et al. | |
| 8,649,883 B2 | 2/2014 | Lu et al. | |
| 8,755,184 B2 | 6/2014 | Peng et al. | |
| 8,767,427 B2 | 7/2014 | Wallmeier | |
| 9,065,345 B2 | 6/2015 | Rigbers et al. | |
| 9,241,397 B2 | 1/2016 | Kaneko et al. | |
| 9,332,602 B2 | 5/2016 | Roberts et al. | |
| 9,473,028 B1 | 10/2016 | Hoyt | |
| 9,553,747 B2 * | 1/2017 | Ramakrishnan | H04L 27/04 |
| 9,590,424 B2 | 3/2017 | Grisenti et al. | |
| 9,735,702 B2 | 8/2017 | Hu et al. | |
| 9,847,626 B2 | 12/2017 | Mauri Lopez | |
| 10,141,724 B2 | 11/2018 | Jung et al. | |
| 10,340,696 B2 * | 7/2019 | Paine | F01N 3/2066 |
| 10,340,697 B2 * | 7/2019 | Paine | H02J 3/381 |
| 2002/0057342 A1 | 5/2002 | Yoshiyama et al. | |
| 2004/0049321 A1 | 3/2004 | Lehr et al. | |
| 2004/0132497 A1 | 7/2004 | Weese | |
| 2005/0073200 A1 | 4/2005 | Divan et al. | |
| 2005/0160682 A1 | 7/2005 | Quadrio | |
| 2005/0169243 A1 | 8/2005 | Lehr et al. | |
| 2005/0169297 A1 | 8/2005 | Lehr et al. | |
| 2006/0127715 A1 | 6/2006 | Botzelmann | |
| 2007/0230094 A1 | 10/2007 | Carlson | |
| 2008/0205088 A1 | 8/2008 | Chung et al. | |
| 2009/0173033 A1 | 7/2009 | Baxter, Jr. | |
| 2009/0202241 A1 | 8/2009 | Yu et al. | |
| 2010/0014322 A1 | 1/2010 | Harrison | |
| 2012/0024515 A1 | 2/2012 | Wei | |
| 2012/0085612 A1 | 4/2012 | Churchill | |
| 2012/0134107 A1 | 5/2012 | Peng et al. | |
| 2012/0312862 A1 | 12/2012 | Landoll et al. | |
| 2013/0068271 A1 | 3/2013 | Bqoor | |
| 2013/0155662 A1 | 6/2013 | Goschl | |
| 2013/0169055 A1 | 7/2013 | Bats et al. | |
| 2013/0256613 A1 | 10/2013 | Hyde et al. | |
| 2013/0261821 A1 | 10/2013 | Lu et al. | |
| 2013/0346571 A1 | 12/2013 | Putseyeu et al. | |
| 2015/0108897 A1 | 4/2015 | Kaneko et al. | |
| 2015/0134137 A1 | 5/2015 | Perju et al. | |
| 2015/0219554 A1 | 8/2015 | Hedges et al. | |
| 2015/0293517 A1 | 10/2015 | Higgins | |
| 2016/0248230 A1 * | 8/2016 | Tawy | F01D 25/285 |
| 2016/0273211 A1 | 9/2016 | Brewer et al. | |
| 2016/0369689 A1 | 12/2016 | Brewer et al. | |
| 2017/0170660 A1 | 6/2017 | Hu et al. | |
| 2017/0237255 A1 | 8/2017 | Inam et al. | |
| 2017/0346322 A1 * | 11/2017 | Kuran | H01M 10/482 |
| 2018/0034280 A1 | 2/2018 | Pedersen | |
| 2018/0109162 A1 * | 4/2018 | Paine | F01N 13/18 |
| 2018/0316163 A1 | 11/2018 | Jung | |
| 2019/0006835 A1 | 1/2019 | Inam et al. | |
| 2019/0237971 A1 * | 8/2019 | Inam | H02J 3/1807 |
| 2020/0028442 A1 * | 1/2020 | Inam | H02H 9/02 |
| 2020/0067309 A1 * | 2/2020 | Ginart | H02J 3/1835 |

* cited by examiner

CONTAINERIZED POWER FLOW CONTROL SYSTEMS

CROSS-REFERENCE TO RELATED APPLICATIONS

This application is a continuation of U.S. patent application Ser. No. 16/035,976 filed Jul. 16, 2018, which claims the benefit of U.S. Provisional Patent Application No. 62/634,057 filed Feb. 22, 2018, the entireties of which are incorporated herein by reference.

BACKGROUND OF THE INVENTION

1. Field of the Invention

This invention relates to containerized solutions for installing power flow control systems on the electric grid.

2. Prior Art

Modular power flow control systems have been developed, wherein the modules may incorporate power transformers, or may be transformerless, such as those employing transformerless static synchronous series converters (TL-SSSCs). Such modular systems are normally intended for permanent deployment and involve non-standard components in hardware as well as in software customized to specific sites, thereby requiring long lead times, typically years, for planning, design, construction and installation. Such systems are not designed for ease of shipping and fast installation, and therefore are not suitable for emergency situations.

DETAILED DESCRIPTION OF THE PREFERRED EMBODIMENTS

Thus, it is desirable to create a new type of portable, modular, containerized power flow control solution wherein each module is containerized and designed to make the portable power flow control system simple to transport, install, operate, and scale.

Disaster relief areas and areas affected by blackouts may require a rapid deployment of a power flow control system to stabilize the power distribution system in the area. Typically, containerized Flexible AC Transmission Systems (FACTS) devices of the present invention are deployed to substations or to high voltage transmission line areas. Power flow control issues may include: specific, planned construction support; non-specific, unplanned construction support; emergency transmission support; short-term interconnection; short-term congestion; maintenance outages; and, emergency response to weather events. Additionally, areas where new installations of electric power are needed or where permits or land area are difficult to obtain may also benefit from a modular, containerized, compact, easy-to-transport and easy-to-install solution. The permitting process may require both Public Utilities Commission (PUC) and International Standards Organization (ISO) approval. Furthermore, since the needs of the grid change over time, a portable solution provides a utility with the flexibility it needs to adapt to unpredicted changes in the power system.

The container itself may be an ISO 40×8×8.5-foot container, or any variant that is allowed on highways or defined by alternative shipping systems. The power flow control devices may be loaded into the containers in various configurations to be maximized for energy density and may include equipment corresponding to one or three phases within a container. Each container may include multiple impedance injection modules, at least one bypass switch, insulation and support equipment, and interconnection component (interconnection equipment). As an example, each impedance injection module shown in FIG. 3 may be configured to inject 2 kVAR of reactive power per kilogram weight of the impedance injection module. Multiple containers may be used for a full mobile power flow control system solution.

A containerized FACTS module of the present invention may modify a system variable of a power system, typically reactive power. The containerized module typically also includes control devices, fault protection devices, a communication subsystem for communicating with the existing power distribution system, and an interconnection component.

Regarding the interconnection component, transmission lines typically end at substations and are supported by terminal deadend structures that are designed to take the full conductor tension load. Substations maintain controlled access and have security access protocols to ensure only authorized personnel can enter the site. The interconnection component that may be carried in an interconnection trailer is typically designed to tap to either the conductors or bus work inside the substation. As part of the interconnection process, the line may need to be physically disconnected by removing a jumper, replacing an existing connection, or splicing a strain insulator onto the conductor. Substations typically have limited areas available for installations, thus, another design option is to install the containerized FACTS modules directly onto a free-standing transmission line. In this embodiment, the ground terrain is varied, and the transport system must accommodate a wide variety of terrains. One deployment option is to tap near a deadend structure; these are typically found at line angles or crossings. Deadend structures may have a jumper which is a slacked span conductor that connects the end of two strain insulators to maintain electrical clearances to the structure. Alternatively, splicing a strain insulator onto the conductor creates a location to aerial tap the conductors mid span between structures.

While the above discussion shows that possible configurations of a containerized power flow control system are many and varied, several useful configurations are described herein for specificity. A person of ordinary skill in the art will understand that these examples are not limiting, and that many combinations and variations of the described containerized power flow systems are possible.

Figure 1:
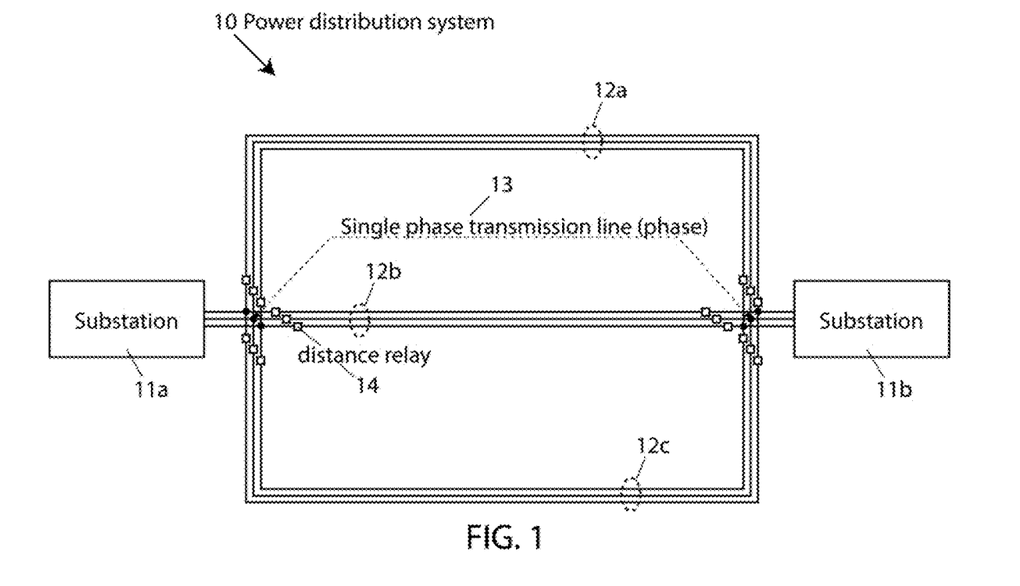
FIG. 1 is a schematic view of a power distribution system comprising a transmission line mesh, with each branch of the mesh comprising three phases, and each phase having a distance relay provided at each end of each branch.

FIG. 1 shows a power distribution system 10 spanning between a pair of substations 11a and 11b. Power distribution system 10 comprises a mesh network of transmission lines having three phases per branch, 12a, 12b, 12c. Each single phase 13 of a three-phase branch typically has a distance relay 14 at each end. The distance relays represent a primary protection system in many power distribution systems.

Figure 2:
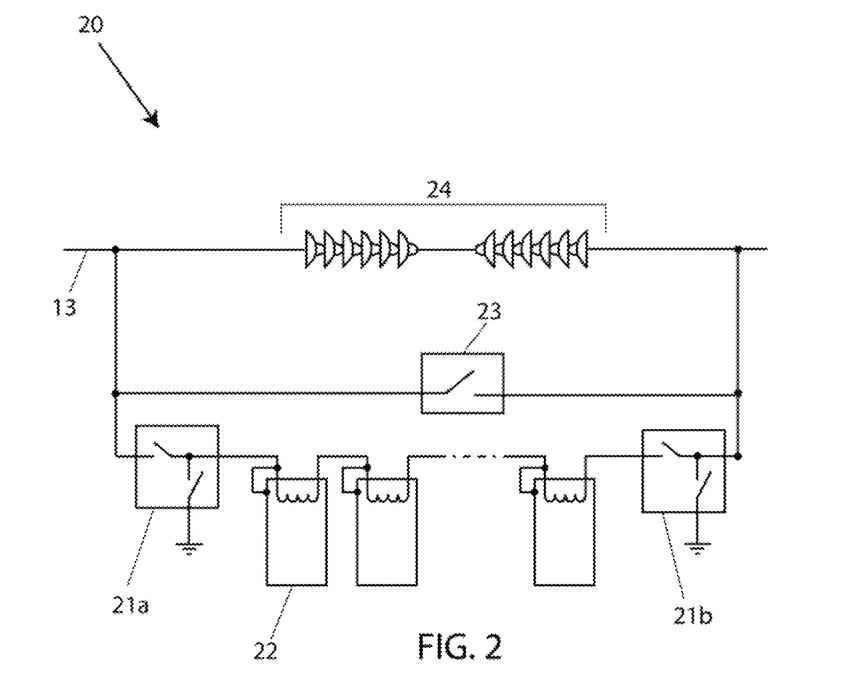
FIG. 2 is a schematic showing an exemplary power flow control system comprising transformer-based impedance injection modules installed on a phase of a power distribution system.

FIG. 2 shows details of a power flow control system 20 installed in a single phase 13 of a power transmission line such as shown in FIG. 1. A break in Phase 13 is achieved using a strain insulator 24 as shown. Disconnect switches 21a and 21b are shown, for routing power during installation, and providing protection to the installation crew. A plurality of impedance injection modules 22 are shown, each incorporating a power transformer. A bypass switch 23 is also shown, providing a means to bypass the impedance injection modules for maintenance or repair for example.

Figure 3:
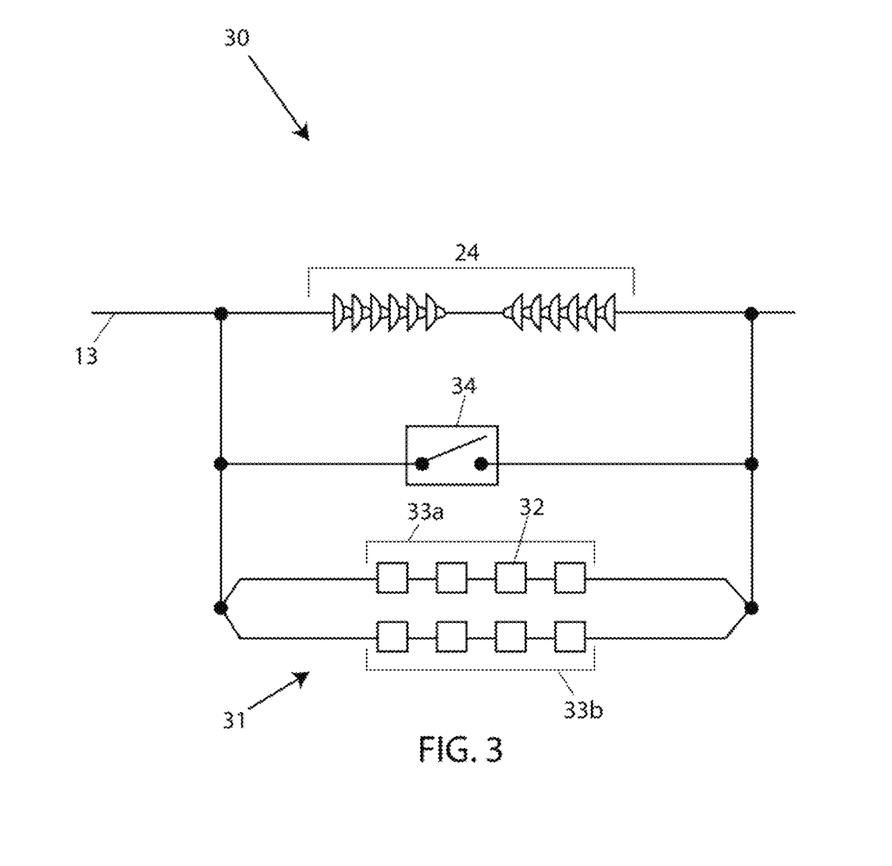
FIG. 3 is a schematic showing an exemplary power flow control system comprising transformer-less impedance injection modules installed on a phase of a power distribution system.

FIG. 3 shows details of another power flow control system 30 installed in a single phase 13 of a power transmission line such as shown in FIG. 1. A break in Phase 13 is achieved using a strain insulator 24 as shown. An m×n matrix 31 of impedance injection modules is shown, where m equals the number of impedance injection modules 32 connected in series in each of n parallel branches 33a and 33b. In FIG. 3, m=4 and n=2. A bypass switch 34 is also shown, providing a means to bypass the parallel connected series of impedance injection modules for maintenance or repair for example. In FIG. 3, each of the impedance injection modules 32 may be a transformerless static synchronous series converter (TL-SSSC) for example.

Impedance injection modules 22 and 32, and bypass switches 23 and 34 are exemplary components of Flexible AC Transmission Systems (FACTs).

Figure 4:
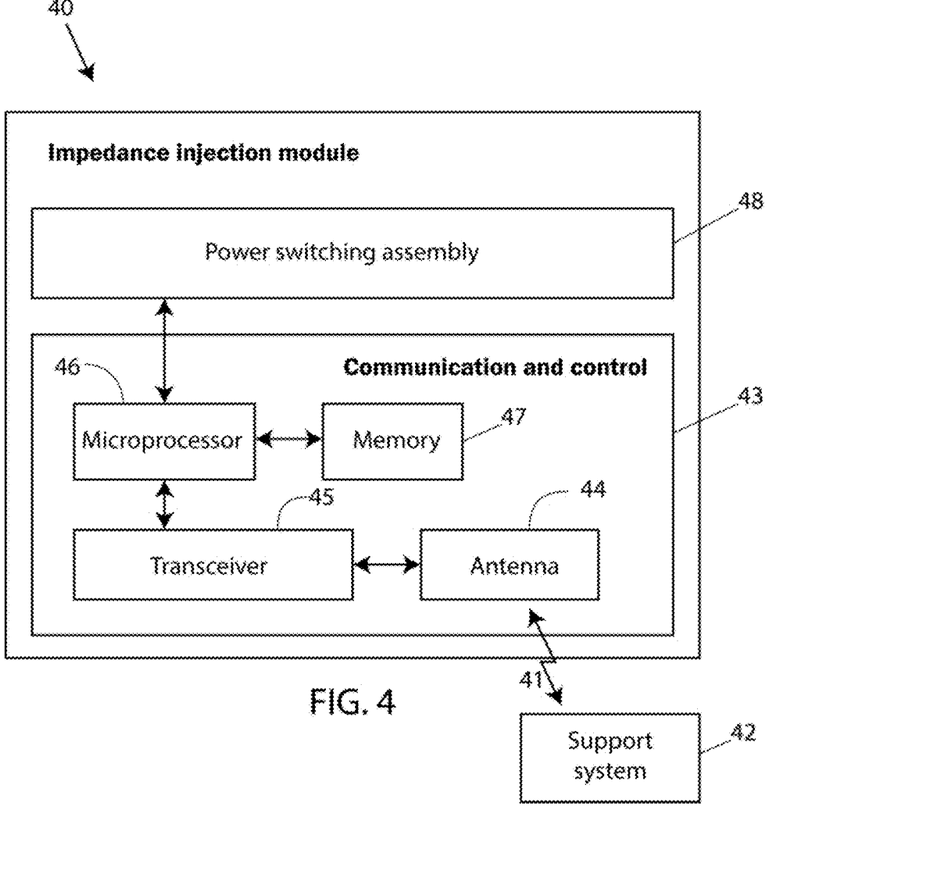
FIG. 4 is a block diagram of an exemplary impedance injection module, as used in embodiments of the present invention.

FIG. 4 is a block diagram of a typical impedance injection module 40 that communicates wirelessly 41 with an external support system 42. Support system 42 may have supervisory control over the power distribution system 10 of FIG. 1. Impedance injection module 40 comprises a communication and control subsystem 43 including an antenna 44, a transceiver 45, a microprocessor 46 and a memory 47. Memory 47 contains instructions executable by microprocessor 46 for configuring, controlling, and reporting out of impedance injection module 40. During operation, microprocessor 46 commands a power switching assembly 48 that connects impedance injection module 40 into phase line 13, to implement a power flow control system such as 20 of FIG. 2 or 30 of FIG. 3. In a typical containerized system in accordance with the present invention, each FACTS device, impedance injection module or not, includes a similar communication and control subsystem so that the support system may have supervisory control over the entire containerized power flow control system and the FACTS devices therein, and preferably in coordination with the rest of the power distribution system.

Figure 5:
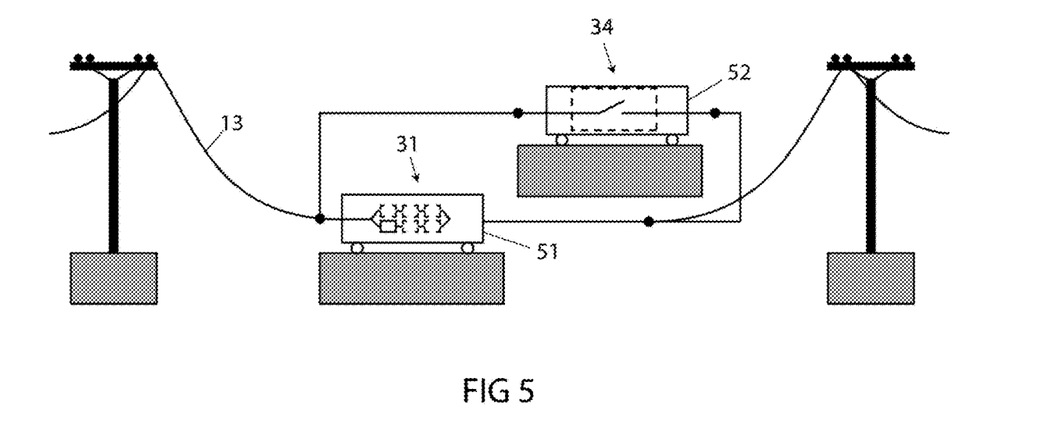
FIG. 5 is a schematic view of a containerized power flow control system operating from two containers, each container carried on a trailer.

FIG. 5 shows a pair of trailers carrying containers 51 and 52 for installation of a portable power flow control system such as 20 of FIG. 2 or 30 of FIG. 3. Container 51 carries a matrix of m×n impedance injection modules such as 22 of FIG. 2 or 32 of FIG. 3. Container 52 carries a bypass switch such as 23 of FIG. 2 or 34 of FIG. 3. The power flow control equipment shown in containers 51 and 52 remains resident in the respective container during operation of the transmission line (phase) 13, such as depicted in FIG. 1. By using standardized impedance injection modules such as 22 of FIG. 2 or 32 of FIG. 3, they can be deployed quickly in an active power distribution system such as 10 of FIG. 1. After operation for a period of days, weeks, months, or years, these impedance injection modules can be redeployed in another portable power flow control system having different requirements. Thus, in embodiments of the present invention, mobile containerized power flow control systems can be deployed rapidly and effectively, and then redeployed rapidly and effectively, to provide versatile and cost-effective power flow control measures under varying field conditions.

Figure 6:
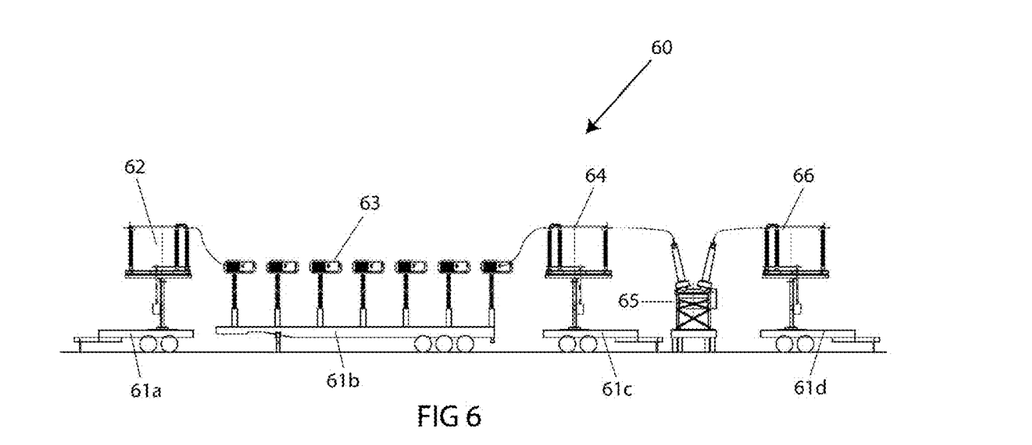
FIG. 6 is a schematic view of an exemplary trailer-based installation of a power flow control system.

FIG. 6 illustrates a portable power flow control system 60 comprising 4 trailers 61a, 61b, 61c and 61d. Trailer 61a holds switchgear, trailer 61b holds impedance injection modules, and trailers 61c and 61d hold supporting connection electronics and a relay and a protection configuration.

Figure 7:
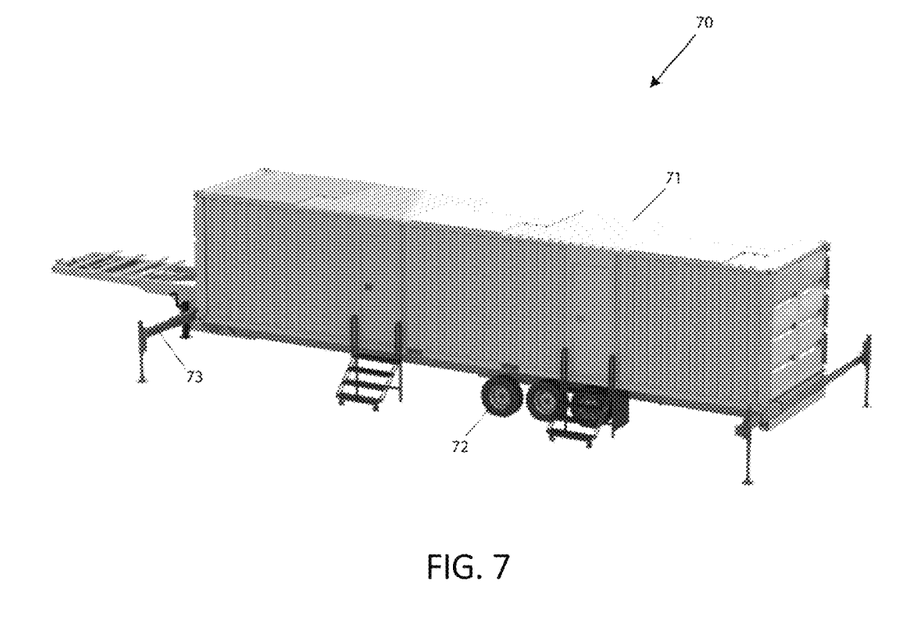
FIG. 7 shows a container deployed in an embodiment of the present invention.

FIG. 7 shows a containerized module 70. Containerized module 70 includes a standard ISO container 71 that is carried on a trailer with wheels 72, and the trailer is stabilized by outriggers 73.

Figure 8:
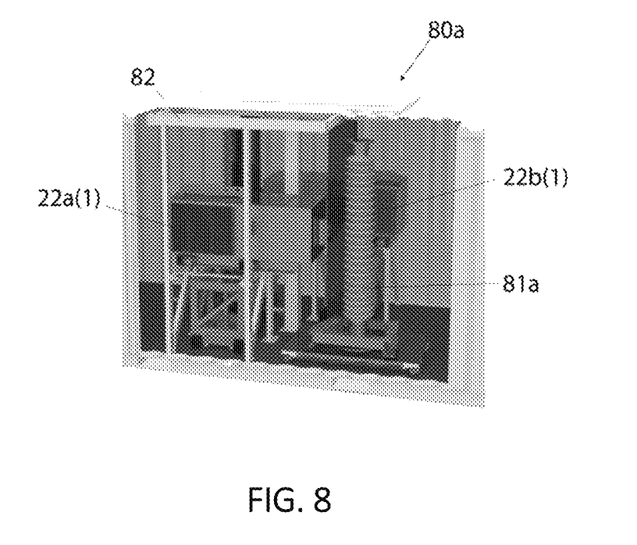
FIG. 8 is an expanded view of stowed equipment in a container deployed in an embodiment of the present invention.

FIG. 8 shows a compartment 80a of container 71, with stowed flow control system components inside. Contained within compartment 80a are a pair of impedance injection modules 22a(1) and 22b(1), an insulator post 81a and a roof platform 82.

Figure 9:
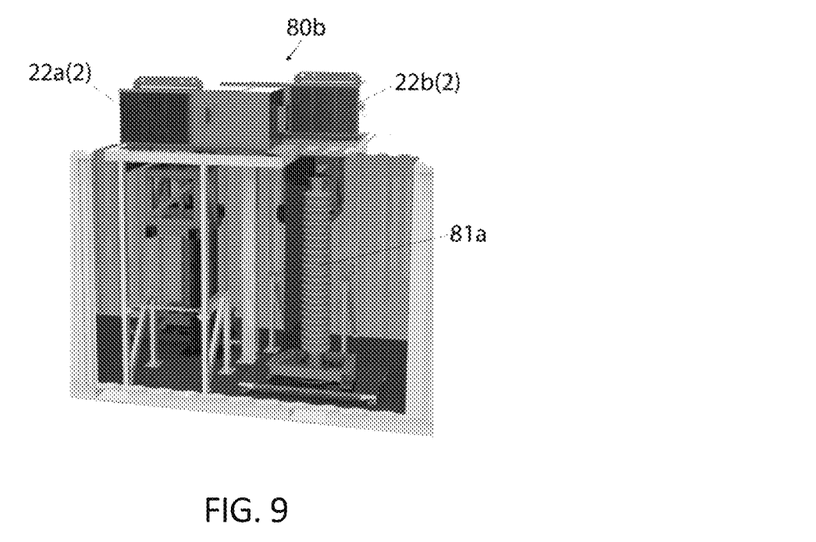
FIG. 9 shows impedance injection modules lifted to the roof of a container deployed in an embodiment of the present invention.

FIG. 9 shows compartment 80b wherein impedance injection modules 22a(1) and 22b(1) have been raised to the roof position using a lifter where they are labeled 22a(2) and 22b(2). Since impedance injection modules 22a(2) and 22b(2) may weigh around 3600 pounds in some embodiments, a hydraulic lifter may be used. Other types of lifters including a crane may also be used.

Figure 10:
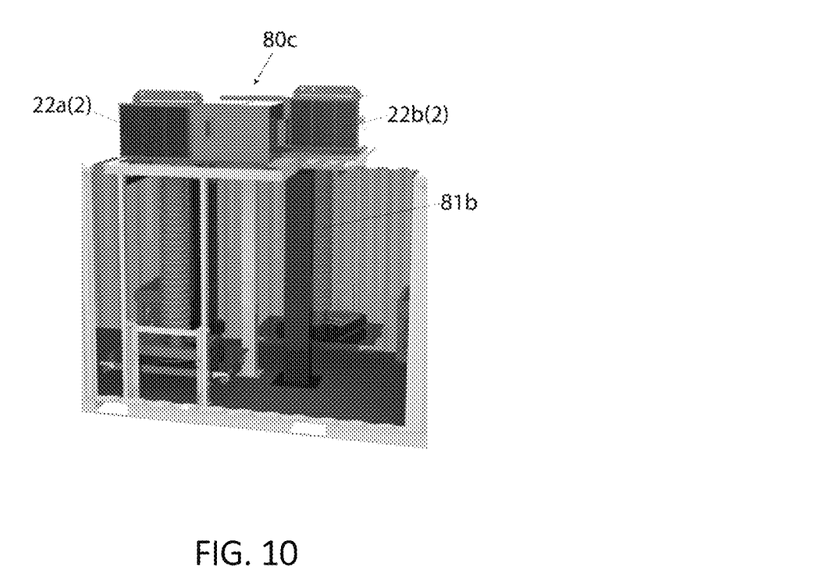
FIG. 10 shows an insulator post lifted to the base of an impedance injection module deployed in an embodiment of the present invention.

FIG. 10 shows compartment 80c wherein insulator post 81a has been lifted up to interface with impedance injection module 22b(2) and is labeled 81b in its new location.

Figure 11:
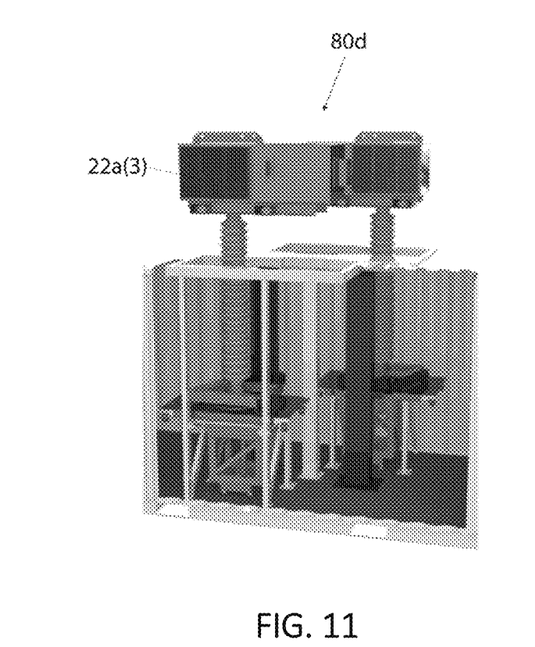
FIG. 11 shows lifting of impedance injection modules to a midway height, in an embodiment of the present invention.

FIG. 11 depicts a mid-way lift of the two impedance injection modules shown in FIGS. 8-10, together with their insulator posts. At this intermediate height, electrical connections to the impedance injection modules may conveniently be made by a member of the installation crew.

Figure 12:
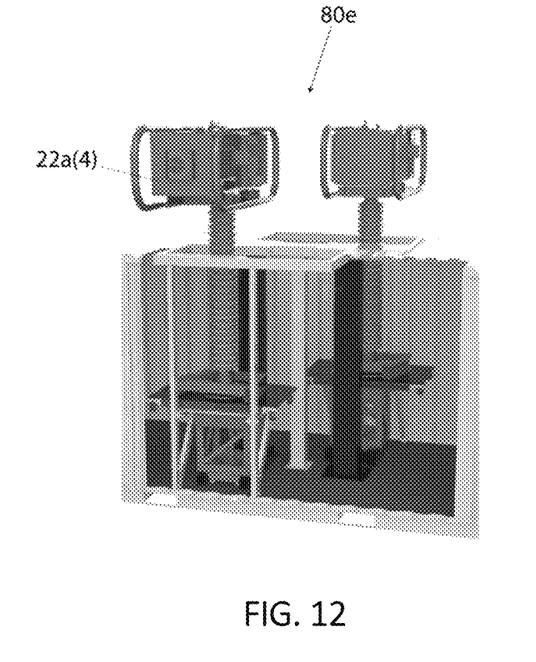
FIG. 12 shows rotated impedance injection modules in an embodiment of the present invention.

FIG. 12 shows that the two impedance injection modules have been rotated, in this case by 90 degrees. Other rotation angles may be used. This rotation may be utilized to improve electrical clearances between components of the two modules.

Figure 13:
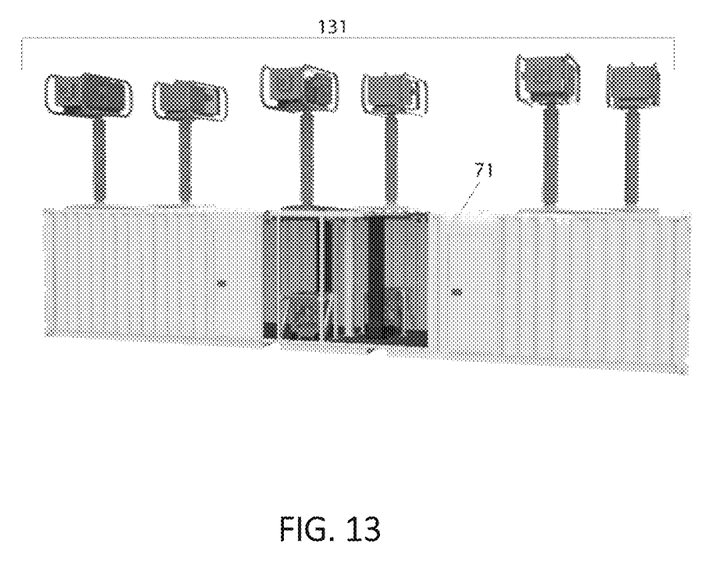
FIG. 13 shows a container with fully deployed impedance injection modules in an embodiment of the present invention.

FIG. 13 shows three pairs of impedance injection modules that have been raised to the final deployment height, following their electrical connection. A lower cost installation procedure is made possible by lifting the impedance injection modules two at a time. Since this final raising of the impedance injection modules is performed after electrical connections have been made, and since the electrical connections involve stiff and unyielding components, to minimize mechanical stress there is a tolerance of around 12 mm for the final height of each impedance injection module. As an example, this tolerance may be achieved using a hydraulic lifter with an equalization valve for equalizing the hydraulic pressure at each of the two individual lifters. Alternative lift systems may comprise simultaneous lifting of a pair of modules using a screw drive system, simultaneous lifting of up to 10 modules using a pressure equalizing valve system, or simultaneous lifting of up to 10 modules using a screw drive system, wherein each of a plurality of screw drives is mechanically coupled to the other screw drives of the screw drive system.

Figure 14:
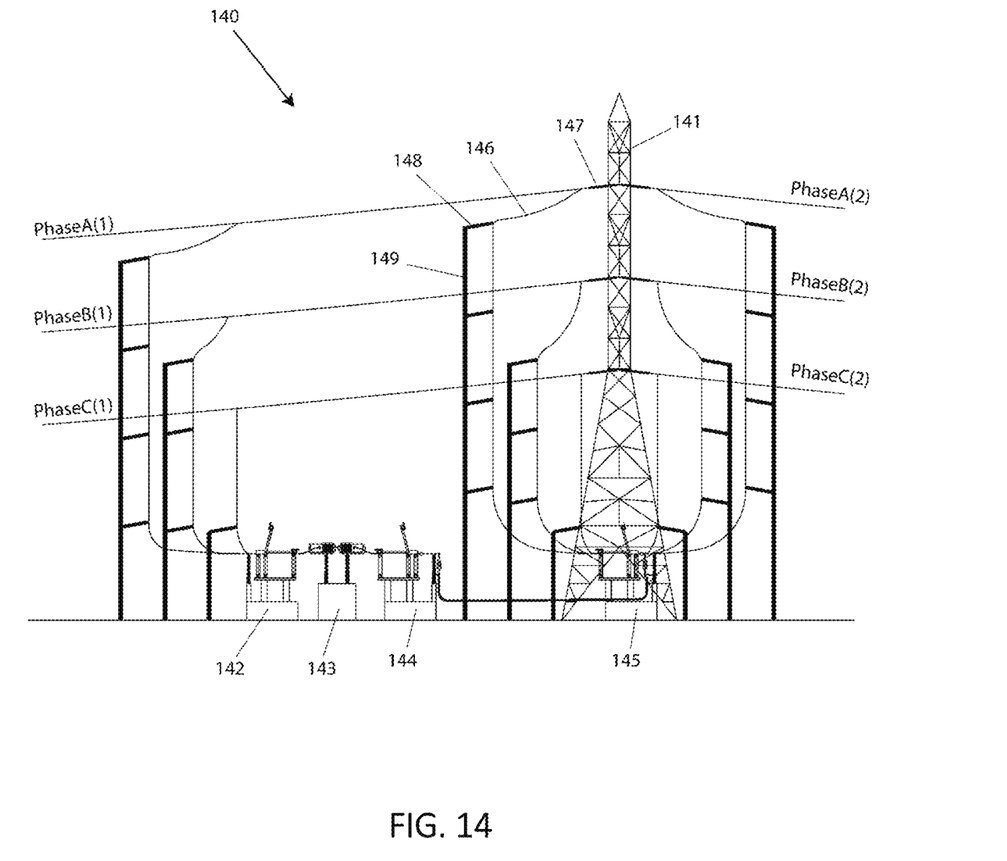
FIG. 14 is a view of electrical connections from containerized equipment to a transmission line tower, in an embodiment of the present invention.

FIG. 14 shows some of the electrical connections to be made at an installation 140 of a power flow control system of the present invention, in the vicinity of a transmission line tower 141. Trailers 142, 143, 144 and 145 are shown. Trailer 142 contains a disconnect switch such as 21a of FIG. 2. Trailer 143 contains a set of impedance injection modules such as set 131 of FIG. 13. Trailers 144 and 145 contain a second and a third disconnect switch in this embodiment. A jumper cable 146 is shown connecting between a conductor at the end of a strain insulator 147 and a post insulator 148, and further connecting to the third disconnect switch in trailer 145, with a portion captured by riser structures 149. To describe the possible power routings, we shall focus on Phase A only. Phase A(1) can be connected to Phase A(2) using the third disconnect switch contained in trailer 145, without passing through the impedance conversion modules contained in trailer 143 by opening disconnect switch in trailer 142 and 144. Alternatively, Phase A(1) can be connected through the disconnect switches contained in trailer 142 and 144 to associated impedance injection modules in trailer 143, and with disconnect switch 145 open to Phase A(2), in order to connect the mobile power flow control system into Phase A of the transmission line. The disconnect switches are rated at line voltages typically between 69 kV and 345 kV.

It should be noted that the word module as used herein has been used in a general, usually functional sense as an extension of the word modular to emphasize the fact that a complete power flow control system may be assembled by interconnecting multiple modules, though such modules may or may not be self-contained within their own separate case or housing, but are within or supported by a respective container for transport and as well as when in operation. Also generally the modules or functional components within a container are used together, usually in combination with the modules or functional components in one or more other containers.

Figure 15:
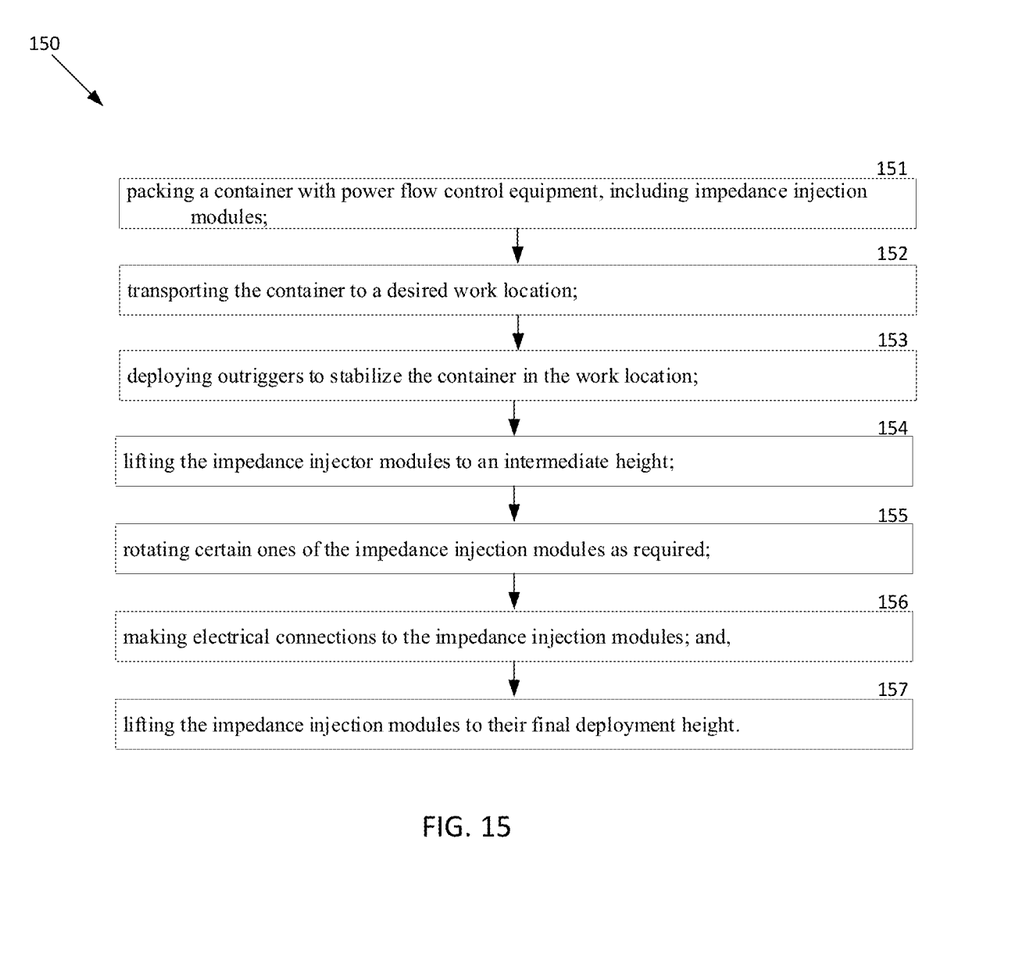
FIG. 15 is a flow chart of an installation method of the present invention.

FIG. 15 is a flow chart 150 of an installment method of the present invention, comprising: packing a container with power flow control equipment, including impedance injection modules, step 151; transporting the container to a desired work location, step 152; deploying outriggers to stabilize the container in the work location, step 153; lifting the impedance injection modules to an intermediate height, step 154; rotating certain ones of the impedance injection modules as required, step 155; making electrical connections to the impedance injection modules, step 156; and, lifting the impedance injection modules to their final deployment height, step 157.

Thus the present invention has a number of aspects, which aspects may be practiced alone or in various combinations or sub-combinations, as desired. Also while certain preferred embodiments of the present invention have been disclosed and described herein for purposes of exemplary illustration and not for purposes of limitation, it will be understood by those skilled in the art that various changes in form and detail may be made therein without departing from the spirit and scope of the invention.

What is claimed is:

1. A containerized system for transporting and deploying a power flow control system for a power transmission line, the containerized system comprising:
the power flow control system including:
an upstream connection configured to be coupled to an upstream portion of the power transmission line,
a downstream connection configured to be coupled to a downstream portion of the power transmission line, and
one or more impedance injection modules configured to inject reactive power to the power flow control system, and electrically coupled between the upstream connection and the downstream connection;
at least one container for installation of the power flow control system, each of the at least one container includes at least one of the one or more impedance injection modules;
wheels for transporting the container; and
outriggers for stabilizing the container;
wherein the containerized system is configured to be deployed on an as needed basis.

2. The containerized system of claim 1 wherein the containerized system is disposed in a substation.

3. The containerized system of claim 1 wherein the containerized system is disposed at a site reachable by road.

4. The containerized system of claim 3 wherein the power transmission line is a free-standing power transmission line, and the one or more impedance injection modules is installed directly onto the free-standing power transmission line, while being disposed in the at least one container or being supported by the at least one container.

5. The containerized system of claim 4 wherein the one or more impedance injection modules is disposed in the at least one container or being supported by the at least one container during operation.

6. The containerized system of claim 5 wherein the one or more impedance injection modules is operable to inject 2 kVAR of reactive power per kilogram weight of the one or more impedance injection modules.

7. The containerized system of claim 1 wherein the power flow control system further includes multiple flexible alternating current transmission system (FACTS) devices, the multiple FACTS devices include the one or more impedance injection modules.

8. The containerized system of claim 7 wherein the the power flow control system further includes a bypass switch.

9. The containerized system of claim 7 wherein each of the one or more impedance injection modules is a transformerless static synchronous series converter.

10. The containerized system of claim 7 wherein the multiple FACTS devices further include at least one disconnect switch.

11. The containerized system of claim 1 wherein the power flow control system further includes a communication subsystem for communicating with a power distribution system.

12. The containerized system of claim 1 wherein the power flow control system further includes at least one bypass switch.

13. A method for deploying a power flow control system comprising:

providing the power flow control system including:
an upstream connection configured to be coupled to an upstream portion of a power transmission line,
a downstream connection configured to be coupled to a downstream portion of the power transmission line, and
one or more impedance injection modules configured to inject reactive power to the power flow control system, and electrically coupled between the upstream connection and the downstream connection;
providing at least one container for installation of the power flow control system;
providing wheels for transporting each of the at least one container;
providing outriggers for stabilizing each of the at least one container;
providing at least one of the one or more impedance injection modules in each of the at least one container;
transporting the at least one container to a site adjacent to the power transmission line;
connecting the upstream connection to the upstream portion of the power transmission line;
connecting the downstream connection to the downstream portion of the power transmission line; and
operating the one or more impedance injection modules while the one or more impedance injection modules are contained or supported by the at least one container.

14. The method of claim 13 wherein the power flow control system further includes multiple flexible alternating current transmission system (FACTS) devices, the multiple FACTS devices include the one or more impedance injection modules.

15. The method of claim 14 wherein each of the one or more impedance injection modules is a transformerless static synchronous series converter.

16. The method of claim 14 wherein the multiple FACTS devices further include at least one bypass switch.

17. The method of claim 14 wherein the multiple FACTS devices further include at least one disconnect switch.

18. The method of claim 13 wherein the power flow control system further includes a wireless communication module for communicating with a power distribution system.

* * * * *